April 3, 1962 J. M. SACKS 3,028,507

TRANSISTOR BISTABLE MULTIVIBRATOR WITH BACK-BIASED DIODE CROSS-COUPLING

Filed Aug. 23, 1957

INVENTOR.
JACOB M. SACKS

BY

ATTORNEYS 3,028,507

TRANSISTOR BISTABLE MULTIVIBRATOR WITH BACK-BIASED DIODE CROSS-COUPLING

Jacob M. Sacks, Corona, Calif., assignor to the United States of America as represented by the Secretary of the Navy Filed Aug. 23, 1957, Ser. No. 680,031
5 Claims. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

This invention relates to a transistor bistable multivibrator and more particularly to multivibrator circuits utilizing transistors with back-biased semi-conductor diodes operated in the breakdown region and current limiting resistors as stabilizing elements to saturate the transistors and provide rectangular pulses with sufficient output amplitude and with one polarity clamped close to ground.

Previous transistor bistable multivibrators are unreliable, require careful selection of transistors and are generally incapable of operating at high temperatures.

The present invention as exemplified in the three modifications disclosed herein consists essentially of a pair of transistors connected to a suitable D.-C. power supply and having a current limiting resistor connected to the base of each transistor and through a back-biased diode to the collector of the other transistor. Stability is inherent in this circuit, since both of the diodes are operated in the breakdown region at all times and therefore a constant potential is maintained across them independent of current through them and independent of temperature to a high degree. The current limiting resistors tend to make the base currents of the transistors very nearly independent of the transistor characteristics. The collector of each transistor is connected through a load resistance to the D.-C. power supply. A pair of NPN or PNP transistors may be suitably connected to this power supply in such a way that one transistor will conduct until a pulse is applied to the base circuits at which time the other transistor is switched on and the first transistor is switched off to provide bistable operation. Alternatively, the combination of an NPN and a PNP transistor may be suitably connected to a power supply in such a manner that bistable operation is provided with both transistors on or both off. Such circuits may be used in shift registers, ring counter chains and other pulse circuits where reliability and high temperature stability are necessary.

One object of the present invention is to provide a transistor bistable multivibrator which is simple, reliable and capable of dependable operation at elevated temperatures above 65° C., providing relatively large signal output and not requiring the careful selection of transistors.

Another object of the present invention is to provide a transistor bistable multivibrator which is independent of transistor characteristics in its operation so that no careful selection of transistors is necessary, therefore resulting in greater economy in construction.

A further object of the present invention is to provide a transistor bistable multivibrator circuit which is independent of temperature effects over a wide temperature range.

Still another object of the present invention is to provide a transistor bistable multivibrator which is relatively simple in its circuitry and requires fewer components.

Still another object of the present invention is to provide a transistor bistable multivibrator wherein nearly all of the supply voltage is available as output therefore requiring less power supply.

A still further object of the present invention is to provide a transistor bistable multivibrator which utilizes back-biased semi-conductor diodes operated in the breakdown region and current limiting resistors as stabilizing elements.

Other objects and many of the attendant advantages of this invention will be readily appreciated as the same becomes better understood by reference to the following detailed description when considered in connection with the accompanying drawings wherein.

Figures 1, 2, 3:
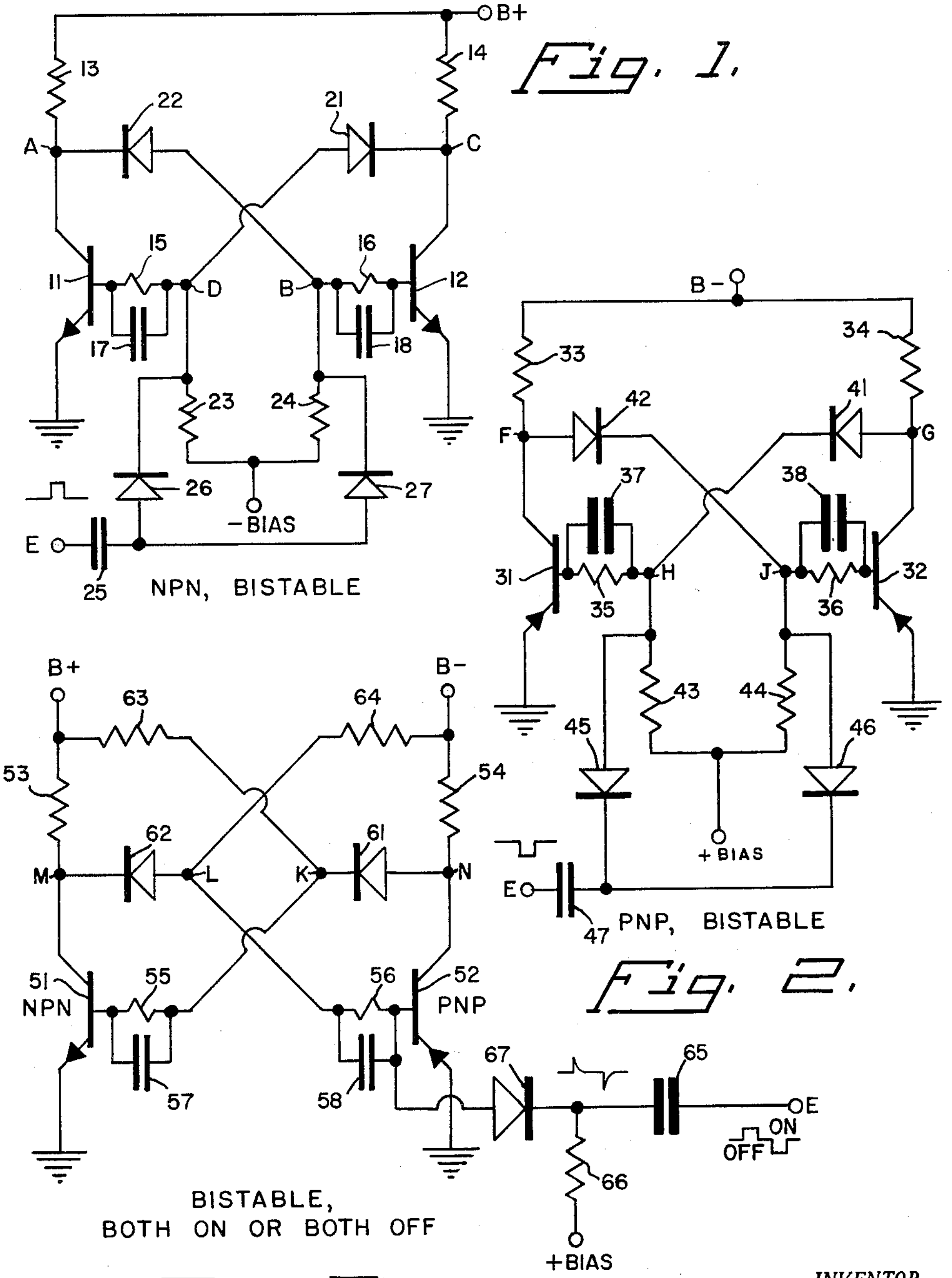
FIG. 1 is a circuit diagram illustrating one preferred embodiment of the present invention utilizing a pair of NPN junction transistors.
FIG. 2 is a circuit diagram illustrating another preferred embodiment of the present invention similar to that shown in FIG. 1 but utilizing a pair of PNP transistors.
FIG. 3 is a circuit diagram illustrating still another preferred embodiment of the present invention utilizing a combination of NPN and PNP junction transistors to provide bistable operation with both transistors on or both off.

Referring now to the drawings in detail and more particularly to FIG. 1, a pair of NPN junction transistors 11 and 12 have their emitters connected to ground and their collectors connected through the resistance 13 and resistance 14 respectively to a B+ source of voltage. The base of each of the transistors 11 and 12 is connected through a parallel RC combination of the current limiting resistors 15 and 16 and the speed-up condensers 17 and 18 to the junction points D and B respectively.

Points D and B are connected through the diodes 21 and 22 to the junction points A and C respectively and the collector circuits of the opposite transistors between the collectors and the load resistances 13 and 14.

Junction points D and B also connect the transistor base circuits through the resistances 23 and 24 to a negative bias. A switching pulse such as the rectangular pulse illustrated is applied to the terminal E through a condenser 25 and the forward biased diodes 26 and 27 to the junction points between point D and resistance 23 and point B and resistance 24 respectively. It will be apparent that the circuit illustrated in FIG. 1 may be operated in different manners but in one typical example, assuming that the B+ supply voltage is plus 10 volts and the transistor 11 is conducting with transistor 12 off, then most of the 10 volts B+ appears across the resistance 13 and point A would be very near ground potential at a voltage such as +0.1 volt. The diode 21 is preferably of the silicon junction type and is operated in its breakdown region with a back-bias. Current would flow through the series combination of diode 21 and the parallel combination of resistance 24 and resistance 16 in series with the input base resistance of transistor 12. The bias is chosen at some value such as −10 volts such that point B is negative with respect to ground at a value such as −1 volt. Therefore the base emitter circuit of transistor 12 is biased off and very little current flows through the resistance 16. The small current that does flow is in the backward direction and biases the collector circuit of transistor 12 off. Therefore point C is at a high potential such as +9.9 volts with respect to ground very near to the B+ voltage except for the small drop across the resistance 14 due to current flow through the diode 22.

Diode 22 is identical to the diode 21 and also operates in the breakdown region. Point D is highly positive at a voltage such as +8.8 volts and causes current to flow through the resistance 15 and the base emitter circuit of transistor 11 in the forward conducting direction. This current is limited by the resistance 15 which is much larger than the base emitter resistance of the transistor 11, but the current is sufficient to cause heavy conduction in the collector circuit of transistor 11.

This condition with transistor 11 on and transistor 12 off will persist until a pulse at E switches transistor 11 off and transistor 12 on, since the diodes 26 and 27 are back to back and the diode 26 will be connected to a relatively high positive voltage at point D whereas the diode 27 will have a negative voltage at point B, thus causing the transistor 12 to conduct with a lowering of the voltage at points C and D to cut off the transistor 11. This triggering circuit functions in the same manner as other triggering circuits commonly used in conjunction with multivibrator circuits.

The condensers 17 and 18 are conventional speed-up capacitors for increasing the speed of operation and increasing the rise time, thus improving the triggering in the conventional manner utilized in the well-known flip-flop circuit.

Stability is inherent in this circuit since both of the diodes 21 and 22 operate in the breakdown region at all times and therefore a constant potential is maintained across them independent of current through them and independent of temperature to a high degree. Therefore any change at point A shows up unattenuated at point B, and any change at point C appears without attenuation at point D. The current limiting resistors 15 and 16 tend to make the base current of the transistors very nearly independent of transistor characteristics. The output voltages may be taken off at points A and C or B and D, as desired.

Another modification of the present invention is illustrated in the circuit diagram of FIG. 2 which is substantially identical with the circuit shown in FIG. 1 except for the use of PNP junction transistors and therefore the voltages as well as the diodes are reversed in polarity.

This circuit likewise consists of a pair of transistors 31 and 32 of the PNP junction type which are connected to a B− supply voltage through the load resistors 33 and 34.

Each of the transistors 31 and 32 has an RC circuit in series with the base circuit thereof consisting of the current limiting resistors 35 and 36 with the speed-up capacitors 37 and 38. The diodes 41 and 42 are connected between the base circuits of the transistors 31 and 32 respectively and the collector circuits of the other transistors, as shown, between the junction points F and G and the junction points H and J.

The junction points H and J adjacent the base circuits of the transistors 31 and 32 are connected through the resistances 43 and 44 to a positive bias and also through the diodes 45 and 46 to a common condenser 47 to which the negative switching pulse is applied for turning one transistor on and the other transistor off. The circuit of FIG. 2 functions in a manner similar to the functioning of the circuits shown in FIG. 1 previously described except for the fact that a negative voltage is applied and a positive bias required with a negative switching pulse to turn the PNP junction transistors on and off. The output voltages may be likewise taken off at points F and G or at H and J.

The bistable multivibrator illustrated in FIG. 3 constitutes another preferred modification of the present invention utilizing a combination of an NPN transistor 51 and a PNP transistor 52 wherein both of the junction transistors are on or both are off.

In this form of the invention a B+ supply is connected across a load resistor 53 to the collector of the NPN transistor 51 and a B− supply voltage is applied across the load resistor 54 to the PNP transistor 52. The emitters of both transistors are preferably grounded or at ground potential, and the RC circuits consisting of the current limiting resistors 55 and 56 and speed-up condensers 57 and 58 are connected in the base circuits of the transistors 51 and 52 respectively.

The junction points K and L are connected to the base circuits of the transistors 51 and 52 respectively through the resistances 55 and 56 and also through the diodes 61 and 62 to the collector circuits of the opposite transistors between the load resistors 53 and 54 and the respective collectors.

The junction points K and L are also connected to the B+ and B− supply voltages respectively through the resistors 63 and 64.

In this form of the invention the transistors are switched both on or both off by a series of positive and negative pulses applied through the condenser 65 which may be provided with a resistor 66 connected to a positive bias source to derive a differentiated waveform which may be applied through the diode 67 to switch the transistors 51 and 52 both on and both off.

In this modification of the present invention, the diodes 61 and 62 may be operated in the breakdown region at all times in both the off and on condition, but are preferably operated in the breakdown condition only during the off portion of the cycle and are open or nonconducting during the on cycle. In the latter form of operation, during the on portion of the cycle, the drop across the resistances 53 and 54 will bring the points M and N substantially down to ground potential for there is just a small potential drop across the transistors 51 and 52 in the conducting condition. With the diodes 61 and 62 nonconducting a small current through the series resistance 63 and 55, and 64 and 56 will maintain a relatively high negative voltage at point K which will keep the transistor 51 of the NPN type conducting and a relatively high positive voltage at the point L will maintain the PNP type transistor 52 conducting. However, the voltage across the diodes 62 and 62 in the on condition will not be sufficient to break down the diodes in the back-biased direction.

When a positive pulse is applied through the condenser 65 and diode 67 transistor 52 is switched off and current will flow through resistance 63, diode 61 in the back-biased direction and through resistance 54 to B− since the voltage between points K and N at this point and under this operating condition will be sufficient to break down the diode 61.

The voltage at K will then become negative switching off the transistor 51 due to the negative voltage applied to the base circuit. Conduction will also take place between B+ and B− through the parallel circuit of resistance 53, diode 62 in the back-biased direction due to breakdown of the diode and through resistance 64 to B−.

The output voltages may be taken off at junction points K and L or at points M and N, as desired.

The circuits of FIG. 1 and FIG. 3 are utilized in a slightly modified form for the multivibrator driver and the channel selector multivibrator in the co-pending application for a Transistorized Time Multiplexer for Telemetering by J. M. Sacks and E. R. Hill, Serial No. 680,029, filed August 23, 1957, now Patent No. 2,981,800.

It will be apparent that the circuits utilizing the basic concepts of the present invention may be utilized in various forms in shift registers, ring counter chains and other pulse circuits where reliability and high temperature stability are necessary, providing independence of transistor characteristics so that no selection of the transistors is necessary, independence of temperature effects over a wide temperature range, and simplicity and economy of circuitry with fewer components. Furthermore, nearly all of the supply voltage is available as output and therefore less is required of the power supply.

Obviously many modifications and variations of the present invention are possible in the light of the above teachings. It is therefore to be understood that within the scope of the appended claims the invention may be practiced otherwise than as specifically described.

What is claimed is:

1. A multivibrator circuit comprising a pair of transistors, a current limiting resistor in the base circuit of each of said transistors, a load resistance in the collector circuit of each of said transistors operable to be connected to a power supply, a back-biased diode operated in the breakdown region and associated with each of said transistors and connected directly between the current limiting resistor in the base circuit thereof and a point between the collector and load resistor of the other of said transistors, said transistors having their emitter circuits connected at ground potential, and means for applying a trigger pulse to the base circuit of at least one of said transistors for switching said transistors on and off.

2. A multivibrator circuit as set forth in claim 1 wherein one of said transistors is an NPN junction type operable to have a positive source of voltage applied thereto through the load resistor associated therewith, the other of said transistors is a PNP junction type operable to have a negative power supply applied thereto through the load resistor associated therewith, and a resistor connected between the base circuit of each of said transistors and its associated power supply.

3. A multivibrator circuit comprising a pair of transistors, a current limiting resistor in the base circuit of each of said transistors, a load resistance in the collector circuit of each of said transistors operable to be connected to a power supply, a back-biased diode operated in the breakdown region and associated with each of said transistors and connected directly between the current limiting resistor in the base circuit thereof and a point between the collector and load resistor of the other of said transistors, said transistors having their emitter circuits connected at ground potential, another resistor connected to the base circuit of each of said transistors and operable to be connected to a bias potential, and means for applying a trigger pulse to the base circuit of at least one of said transistors for switching said transistors on and off.

4. A multivibrator circuit as set forth in claim 3 wherein both of said transistors are of the NPN junction type, said load resistors are adapted to be connected to a positive source of power supply, said other resistors are adapted to be connected to a negative bias, and said means includes a pair of forward-biased diodes associated with said base circuits.

5. A multivibrator circuit as set forth in claim 3 wherein both of said transistors are of the PNP junction type, said load resistors are adapted to be connected to a negative source of power supply, said other resistors are adapted to be connected to a negative bias, and said means includes a pair of forward-biased diodes associated with said base circuits.

References Cited in the file of this patent

UNITED STATES PATENTS

| | | |
|---|---|---|
| 2,737,587 | Trousdale | Mar. 6, 1956 |
| 2,778,978 | Drew | Jan. 22, 1957 |
| 2,787,712 | Priebe et al. | Apr. 2, 1957 |
| 2,802,067 | Zawels | Aug. 6, 1957 |
| 2,820,155 | Linvill | Jan. 14, 1958 |
| 2,880,330 | Linvill et al. | Mar. 31, 1959 |
| 2,916,637 | Wanlass | Dec. 8, 1959 |
| 2,965,768 | Wanlass | Dec. 20, 1960 |

OTHER REFERENCES

"Nonsaturating Pulse Circuits Using Two Junction Transistors," J. G. Linville, Proceeding of the I.R.E., July 1953.